United States Patent
Le et al.

(10) Patent No.: US 9,625,533 B2
(45) Date of Patent: Apr. 18, 2017

(54) LEAD ACID STATE OF CHARGE ESTIMATION FOR AUTO-STOP APPLICATIONS

(71) Applicant: Johnson Controls Technology Company, Holland, MI (US)

(72) Inventors: Daniel B. Le, Grafton, WI (US); Brian C. Sisk, Mequon, WI (US)

(73) Assignee: Johnson Controls Technology Company, Holland, MI (US)

( * ) Notice: Subject to any disclaimer, the term of this patent is extended or adjusted under 35 U.S.C. 154(b) by 432 days.

(21) Appl. No.: 14/253,720

(22) Filed: Apr. 15, 2014

(65) Prior Publication Data

US 2014/0309911 A1    Oct. 16, 2014

Related U.S. Application Data

(60) Provisional application No. 61/812,534, filed on Apr. 16, 2013.

(51) Int. Cl.
| | |
|---|---|
| *H01M 10/44* | (2006.01) |
| *H01M 10/46* | (2006.01) |
| *G01R 31/36* | (2006.01) |

(52) U.S. Cl.
CPC ...... *G01R 31/3651* (2013.01); *G01R 31/3624* (2013.01); *G01R 31/3668* (2013.01)

(58) Field of Classification Search
CPC ........ H02J 7/0036; H02J 7/0034; H02J 7/009; H02J 7/048

(Continued)

(56) References Cited

U.S. PATENT DOCUMENTS

| | | |
|---|---|---|
| 5,321,627 A | 6/1994 | Reher |
| 6,534,954 B1 | 3/2003 | Plett |

(Continued)

FOREIGN PATENT DOCUMENTS

CN    103323781 A    9/2013

OTHER PUBLICATIONS

Wang Huihui et al.; "SOC Estimation and Simulation of Electric Vehicle Lead-acid Storage Battery with Kahlman Filtering Method," The 11th IEEE International Conference on Electronic Measurement & Instruments, ICEMI'2013, pp. 599-603, Aug. 2013.

(Continued)

*Primary Examiner* — Edward Tso
(74) *Attorney, Agent, or Firm* — Fletcher Yoder, P.C.

(57) ABSTRACT

The present disclosure describes a method that includes predicting terminal voltage of a battery module in a vehicle using a battery control module. Predicting the terminal voltage includes determining a gassing current of the battery module using a gassing current model, in which the gassing current quantifies terminal current that is not used to charge the battery module, and calculating the predicted terminal voltage based at least in part on a measurement model and the determined gassing current. The method also includes measuring terminal voltage of the battery module using a sensor communicatively coupled to the battery control module, and determining a corrected state of the battery module using the battery control module by minimizing a difference between the predicted terminal voltage and the measured terminal voltage. In other words, the corrected state of the battery (e.g., corrected state of charge) may be more accurately determined using the measurement model and the gassing current model. As such, this may provide more efficient use of energy.

23 Claims, 5 Drawing Sheets

(58) Field of Classification Search
USPC ...... 320/104, 132, 147, 149; 702/63, 64, 65; 701/112

See application file for complete search history.

(56) References Cited

U.S. PATENT DOCUMENTS

| | | | | |
|---|---|---|---|---|
| 6,618,681 | B2* | 9/2003 | Hoenig | G01R 31/362 307/18 |
| 6,927,554 | B2 | 8/2005 | Tate, Jr. et al. | |
| 7,471,090 | B2* | 12/2008 | Atehortua | G01R 31/3651 320/132 |
| 2006/0197504 | A1* | 9/2006 | Atehortua | G01R 31/3679 320/132 |
| 2012/0041698 | A1 | 2/2012 | Zhang et al. | |

OTHER PUBLICATIONS

B. S. Bhangu et al.; "Nonlinear Observers for Predicting State-of-Charge and State-of-Health of Lead-Acid Batteries for Hybrid-Electric Vehicles." IEEE Transactions on Vehicular Technology, vol. 54, No. 3, May 2005, pp. 783-794.

D. Le et al.; "Lead-Acid State of Charge Estimation for Start-Stop Applications," SAE Int. J. Alt. Power. 2(1):172-178, Apr. 8, 2013.

Schiffer et al.; "Model prediction for ranking lead-acid batteries according to expected lifetime in renewable energy systems and autonomous power-supply systems," Journal of Power Sources, vol. 168, No. 1, Apr. 27, 2007; pp. 66-78.

International Search Report and Written Opinion for PCT Application PCT/US2014/034345 dated Jul. 25, 2014; 10 pgs.

Berndt, D.; "Valve-regulated lead-acid batteries;" Journal of Power Sources 100; Elsevier Science B.V.; Nov. 30, 2001; pp. 29-46.

Vasebi, A. et al.; "A novel combined battery model for state-of-charge estimation in lead-acid batteries based on extended Kalman filter for hybrid electric vehicle applications;" Journal of Power Sources 174; Elsevier B.V.; Apr. 12, 2007, pp. 30-40.

Welch, G. et al.; "An Introduction to the Kalman Filter;" University of North Carolina at Chapel Hill, Chapel Hill, NC, USA; Sep. 17, 1997; pp. 1-16.

Rynkiewicz, R.; "Discharge and Charge Modeling of Lead Acid Batteries;" Applied Power Electronics Conference and Exposition, 1999. Fourteenth Annual (vol. 2); Mar. 1999; pp. 707-710.

Larminie, J. et al.; "Electric Vehicle Technology Explained;" John Wiley & Sons, Ltd, Chichester, UK; Oct. 28, 2003; 303 pages.

Larminie, J. et al.; "Fuel Cell Systems Explained;" Second Edition; John Wiley & Sons, Ltd, Chichester, UK; Mar. 2003; 433 pages.

Simon, D.; "Kalman filtering with state constraints: a survey of linear and non linear algorithms;" IET Control Theory and Applications; Aug. 2010; pp. 1-16.

Salameh, Z. et al.; "A Mathematical Model for Lead-Acid Batteries;" IEEE Transactions on Energy Conversion, vol. 7, No. 1; Mar. 1992; pp. 93-98.

Thele, M. et al.; "Modeling of the charge acceptance of lead-acid batteries;" Journal of Power Sources 168; Elsevier B. V.; Jan. 3, 2007; pp. 31-49.

Ceraolo, M.; "New Dynamical Models of Lead-Acid Batteries;" IEEE Transactions on Power Systems, vol. 15, No. 4; Nov. 2000; pp. 1184-1190.

Choudhury, J.R. et al.; "Real Time State of Charge Prediction Using Kalman Filter;" World Congress on Nature & Biologically Inspired Computing; Dec. 2009; pp. 1-5.

Zhang, J. et al; "State-of-charge estimation of valve regulated lead acid battery based on multi-state Unscented Kalman Filter;" Electrical Power and Energy Systems; Elsevier Ltd.; Oct. 28, 2010; pp. 472-476.

Barbarisi, O. et al.; "State of charge Kalman filter estimator for automotive batteries;" Control Engineering Practice 14; Elsevier, Ltd.; Jun. 16, 2005; pp. 267-275.

Han, J. et al.; "State-of-charge estimation of lead-acid batteries using an adaptive extended Kalman filter;" Journal of Power Sources 188; Elsevier B.V.; Dec. 24, 2008; pp. 606-612.

* cited by examiner

LEAD ACID STATE OF CHARGE ESTIMATION FOR AUTO-STOP APPLICATIONS

CROSS REFERENCE TO RELATED APPLICATION

This application claims priority from and the benefit of U.S. Provisional Application Ser. No. 61/812,534, entitled "LEAD ACID STATE OF CHARGE ESTIMATION FOR START-STOP APPLICATIONS," filed Apr. 16, 2013, which is hereby incorporated by reference in its entirety.

BACKGROUND

The present disclosure relates generally to the field of batteries and battery systems. More specifically, the present disclosure relates to battery systems that may be used in vehicular contexts, as well as other energy storage/expending applications.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Vehicles generally use one or more battery systems to power features in the vehicle including the air conditioning, radio, alarm system, and other electronic systems. To reduce the amount of undesirable emissions produced and improve the fuel efficiency of vehicles, improvements have been made to vehicle technologies. For example, some vehicles, such as a micro-hybrid vehicle, may disable the internal combustion engine when the vehicle is stationary and utilize a battery system to continue powering the electronics as well as restarting (e.g., cranking) the engine when propulsion is desired. As used herein, the ability to disable the engine and restart the engine when a vehicle is stationary is referred to as an "auto-stop" operation.

Accordingly, since the battery system cannot generally recharge during auto-stop, the stability of the vehicle operation may be improved and operation of the vehicle may be optimized by monitoring the ability of the battery system to supply power to the vehicle. For example, this may include determining the state of charge (SOC) of the battery system.

SUMMARY

Certain embodiments commensurate in scope with the disclosed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

A first embodiment describes a method that includes predicting terminal voltage of a battery module in a vehicle using a battery control module. Predicting the terminal voltage includes determining a gassing current of the battery module using a gassing current model, in which the gassing current quantifies terminal current that is not used to charge the battery module, and calculating the predicted terminal voltage based at least in part on a measurement model and the determined gassing current. The method also includes measuring terminal voltage of the battery module using a sensor communicatively coupled to the battery control module, and determining a corrected state of the battery module using the battery control module by minimizing error between the predicted terminal voltage and the measured terminal voltage.

A second embodiment describes a tangible, non-transitory, computer-readable medium storing a plurality of instructions executable by a processor of a battery control module in a vehicle. The instructions include instructions to predict terminal voltage of a battery module in the vehicle using the processor. The instruction to predict the terminal voltage includes instructions to determine a gassing current of the battery module using a gassing current model, in which the gassing current quantifies terminal current that is not used to charge the battery module, and to calculate the predicted terminal voltage using a measurement model and the determined gassing current. The instructions further include instructions to measure terminal voltage of the battery module using a sensor communicatively coupled to the battery control module, and instructions to determine a corrected state of the battery module using the processor by minimizing error between the predicted terminal voltage and the measured terminal voltage.

A third embodiment describes a vehicle including a battery module that supplies electrical power to electrical systems in the vehicle, and a battery control module that recursively determines a corrected state of the battery module using a state space model and a measurement model that predicts an operational parameter of the battery module. The measurement model includes a gassing current module that enables the battery control module to determine amount of current that is actually used to charge the battery module.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed above, vehicle technology has improved to increase fuel economy and/or reduce undesirable emissions compared to more traditional gas-powered vehicles. For example, micro-hybrid vehicles (e.g., hybrid-electric vehicle or plug-in hybrid electric vehicle) disable the vehicle's internal combustion engine when the vehicle is stationary instead of allowing the internal combustion engine to idle. While the vehicle's internal combustion engine is disabled, the battery system may continue supplying power to the vehicle's electrical systems, which may include the vehicle's radio, air conditioning, electronic control units, and the like. Similarly, a vehicle including passive boost may selectively disconnect an alternator to enable the internal combustion engine to use all generated power for propulsion. As such, operations, such as auto-stop or passive boost, the battery system may continue supplying electrical power without being recharged and be recharged at a later time when it is more efficient.

Accordingly, to facilitate stable vehicle operation, it would be beneficial to the monitor the ability of the battery system to supply power to the vehicle. For example, if it is determined that the battery system is unable to continue supplying power, the internal combustion engine may be restarted to supplement and/or recharge the battery system. Generally, the ability of the battery system to supply power is dependent on the state of charge (SOC) of the battery system. As used herein, the "state of charge" is intended to describe the percentage of the battery system's storage capabilities being utilized. For example, a 100% state of charge indicates that the battery system is fully charged and a 0% state of charge indicates that the battery system is fully discharged. In other words, the operation of the vehicle may be based at least in part on the state of charge of the battery system.

Based on the advantages over traditional gas-power vehicles, manufactures, which generally produce traditional gas-powered vehicles, may desire to utilize improved vehicle technologies (e.g., micro-hybrid technology) within their vehicle lines. These manufactures often utilize one of their traditional vehicle platforms as a starting point. Generally, traditional gas-powered vehicles are designed to utilize 12 volt battery systems (e.g., voltage between 7-18 volts), such as a single 12 volt lead-acid battery. Accordingly, the single lead-acid battery may be adapted for the improved vehicle technologies. For example, the lead-acid battery may supply power to the electrical system during auto-stop or passive boost. Thus, it would be beneficial to enable the determination of the state of charge of a lead-acid battery system.

However, the state of charge determination for a lead-acid battery system is complicated by gassing reactions that may take place in the lead-acid battery. To help illustrate, the chemical reaction for charging and discharging a lead-acid battery is as follows:

$$PbO_2 + Pb + 2H_2SO_4 \underset{charge}{\overset{discharge}{\rightleftharpoons}} 2PbSO_4 + 2H_2O \quad (1)$$

However, as a lead-acid battery repeatedly charges, side reactions may occur. For example, the water (i.e., $H_2O$) in the lead-acid battery may dissociate into oxygen and hydrogen gas, which consumes electrons that may otherwise be used for charging the battery. Accordingly, the coulombic efficiency of the lead-acid battery and/or the energy storage capabilities of the lead-acid battery may change as the gassing reaction occurs, which makes it difficult to determine the state of charge of the lead-acid battery.

As such, the present embodiments improve the accuracy of the state of charge determination for a lead-acid battery by taking into account the gassing reaction. For example, as will be described in more detail below, a gassing current model may be developed that quantifies the gassing reaction. More specifically, the gassing current model may be used to determine the amount of current that is actually used by the lead-acid battery (e.g., stored as energy) and the amount of current that is wasted due to the gassing reaction. Based on the gassing current model, a measurement model may be developed that estimates the terminal voltage of the lead-acid battery. In other words, the measurement model uses a model within a model to take into account the gassing reaction. Additionally, the measurement model as well as a state space model may be used in a Kalman filter to recursively determine a corrected state of the lead-acid battery, which includes the corrected state of charge of the lead-acid battery. The corrected state of charge of the lead-acid battery may then be used to control operation of the vehicle (e.g., restarting the internal combustion engine or disconnecting the alternator).

Figure 1:
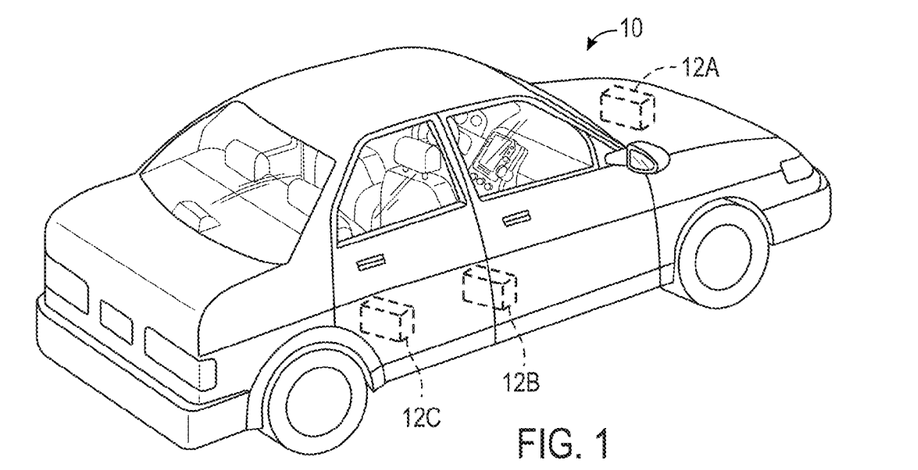
FIG. 1 is a perspective view of a vehicle (e.g., a micro-hybrid vehicle), in accordance with an embodiment of the present approach.

With the foregoing in mind, FIG. 1 is a perspective view of an embodiment of a vehicle 10, such as a micro-hybrid vehicle. Although the following discussion is presented in relation to micro-hybrid vehicles, the techniques described herein may be applied to other vehicles including electrical-powered and gas-powered vehicles. As discussed above, it would be desirable for a battery system 12 to be largely compatible with traditional vehicle designs. Accordingly, the battery system 12 may be placed in a location in the micro-hybrid vehicle 10 that would have housed the traditional battery. For example, as illustrated, the micro-hybrid vehicle 10 may include the battery system 12A positioned similarly to a lead-acid battery of a typical combustion-engine vehicle (e.g., under the hood of the vehicle 10). By further example, in certain embodiments, the micro-hybrid vehicle 10 may include the battery system 12B positioned near a center of mass of the micro-hybrid vehicle 10, such as below the driver or passenger seat. By still further example, in certain embodiments, the micro-hybrid vehicle 10 may include the battery system 12C positioned below the rear passenger seat or near the trunk of the vehicle. It should be appreciated that, in certain embodiments, positioning a battery system 12 (e.g., battery system 12B or 12C) in or about the interior of the vehicle may enable the use of air from the interior of the vehicle to cool the battery system 12 (e.g., using a heat sink or a forced-air cooling design).

Figure 2:
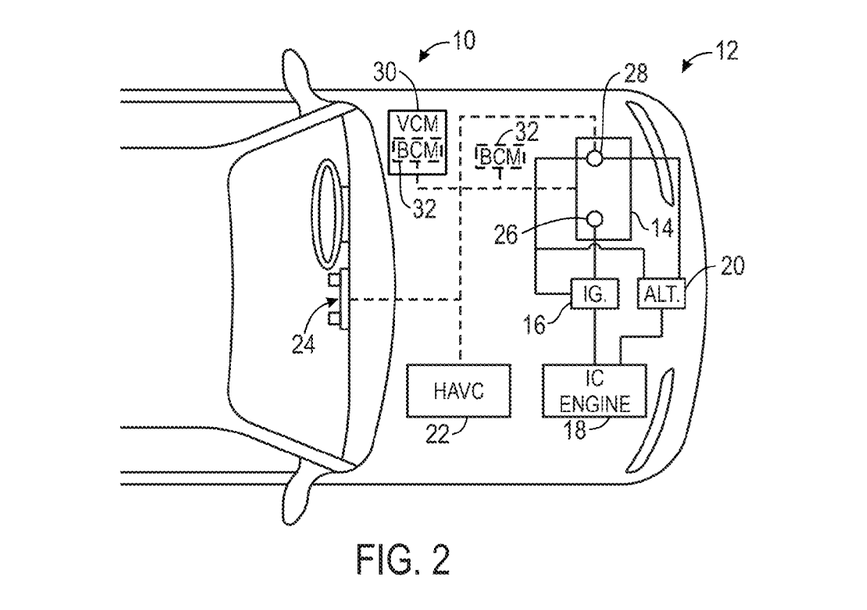
FIG. 2 is a schematic view of the vehicle depicted in FIG. 1 illustrating power distribution through the vehicle, in accordance with an embodiment of the present approach.

To simplify discussion of the battery system 12, the battery system 12 will be discussed in relation to the battery system 12A disposed under the hood of the vehicle 10, as depicted in FIG. 2. As depicted, the battery system 12 includes a battery module 14 coupled to an ignition system 16, an internal combustion engine 18, and an alternator 20. More specifically, the battery module 14 may supply power to the ignition system 16 to start (i.e., crank) the internal combustion engine 18. The alternator 20 may converter mechanical energy, for example produced by the internal combustion engine 18, into electrical energy to charge the battery module 14. Additionally, in some embodiments, the ignition system 16 and the alternator may include a belt starter generator (BSG) to facilitate auto-stop and/or regenerative braking.

As described above, the battery system 12 may supply power to components of the vehicle's electrical system. For example, the battery system 12 may supply power to the radiator cooling fans, climate control system, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, the battery system 12 depicted in FIG. 2 supplies power to a heating, ventilation, and air conditioning (HVAC) system 22 and a vehicle console 24.

To facilitate supply of power from the battery system 12 to the various components in vehicle's electrical systems (e.g., HVAC system 22 and vehicle console 24), the battery module 14 includes a first terminal 26 and a second terminal 28. In some embodiments, the second terminal 28 may provide a ground connection and the first terminal 26 may provide a positive voltage ranging between 7-18 volts.

As depicted, the vehicle 10 also includes a vehicle control module (VCM) 30 that may control and/or monitor operational parameters of the various components of the vehicle 10. For example, the vehicle control module 30 may determine when to charge and/or discharge the battery module 14, when to start or stop the internal combustion engine 18, and so forth. To facilitate such functions, the vehicle control module 30 may include one or more memory and one or more processors. More specifically, the memory may be a tangible non-transitory computer-readable medium that stores instructions executable by the processor.

In some embodiments, the vehicle control module 30 may also control and/or monitor operational parameters related to the battery module 14. Accordingly, as depicted, the vehicle control module 30 may include a battery control module (BCM) 32. Additionally or alternatively, the battery control module 32 may be a standalone module or included directly in the battery module 14. No matter the placement, the battery control module 32 may determine various operational parameters relating to the battery module 14, such as the state of charge of the battery module 14. To help illustrate, the battery module 14 and the battery control module 32 are described in more detail in FIG. 3.

Figure 3:
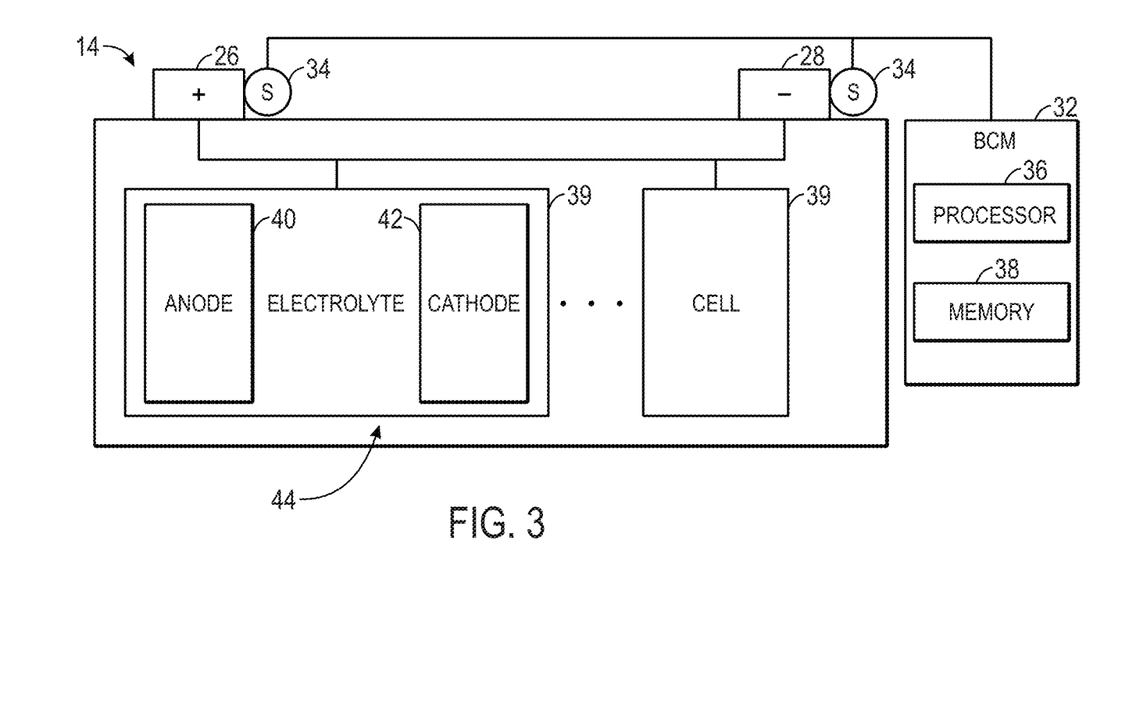
FIG. 3 is a schematic view of a lead-acid battery system, in accordance with an embodiment of the present approach.

To facilitate determining operational parameters of the battery module 14, the battery control module 32 may receive measurements from sensors 34. For example, in the depicted embodiment, the battery control module 32 may receive measurements from sensors 34 coupled to the first terminal 26 and the second terminal 28. More specifically, the sensor 34 may measure operational parameters of the battery module 14, such as current, voltage, and/or temperature at the terminals. In other words, the sensors 34 may include current sensors, voltage sensors, temperature sensors, power sensors, pressure sensors, and the like. In some embodiments, the battery control module 32 may receive the sensor measurements via a wired connection (e.g., serial cable) or a wireless connection and process the sensor measurements to determine various operational parameters. Accordingly, the battery control module includes one or more processor 36 and one or more memory 38. The memory 38 may be a tangible non-transitory computer readable medium that store instructions executable by the processor 36.

As described above, the battery control module 32 may determine the state of charge of the battery module 14. In some embodiments, the depicted battery module 14 may be a lead-acid battery module. Accordingly as depicted, the battery module 14 includes the first (e.g., positive) terminal 26, the second (e.g., ground) terminal 28, and a plurality of battery cells 39 connected in series or in parallel. As depicted, each battery cell may include an anode 40, a cathode 42, and electrolyte 44. Although the present disclosure is primarily described in relation to a lead-acid battery system, one of ordinary skill in the art may adapt the techniques described herein for use with other types of battery systems, such as lithium ion battery systems or dual chemistry battery systems that include a lead-acid battery.

Based on the chemical reaction described in equation (1), when the battery module 14 is fully charged, the cathode 42 is lead (e.g., Pb), the anode 40 is lead-oxide (e.g., $PbO_2$), and the electrolyte 44 is an aqueous solution including water (e.g., $H_2O$) and sulfuric acid (e.g., $H_2SO_4$). When charged, the battery module 14 may supply electrical power as electrons flow out of the cathode 42 via the second terminal 28 and into the anode 40 via the first terminal 26. In other words, current flows out from the first terminal 26 and back into the battery module 14 via the second terminal 28. As the battery module 14 discharged, the anode 40 and the cathode 42 will both become lead sulfate (e.g., $PbSO_4$) and the electrolyte 44 becomes a dilute sulfuric acid (e.g., primarily $H_2O$). As the battery module 14 is charged, for example, by the alternator 20 via the first terminal 26 and the second terminal 28, electrons are removed from the anode 40 and forced into the cathode 42. As such, the cathode 42 again become lead (e.g., Pb), the anode 40 becomes lead-oxide (e.g., $PbO_2$), and the electrolyte 42 becomes aqueous sulfuric acid.

As described above, in addition to the main chemical reaction that enables the battery module 14 to charge and discharge, a side gassing reaction may also take place. More specifically, the water in the electrolyte 44 may dissociate into oxygen and hydrogen gas, particularly when the battery module 14 is charged while at a high state of charge or with a high charging voltage or higher charging current. As described above, the gassing reaction may complicate the state of charge determination because the coulombic efficiency and/or storage capacity of the battery module 14 may change as the amount of water in the electrolyte 44 changes. Accordingly, to improve the accuracy of the state of charge determination, it may be beneficial to quantify the gassing reaction in the battery module 14.

Figure 4:
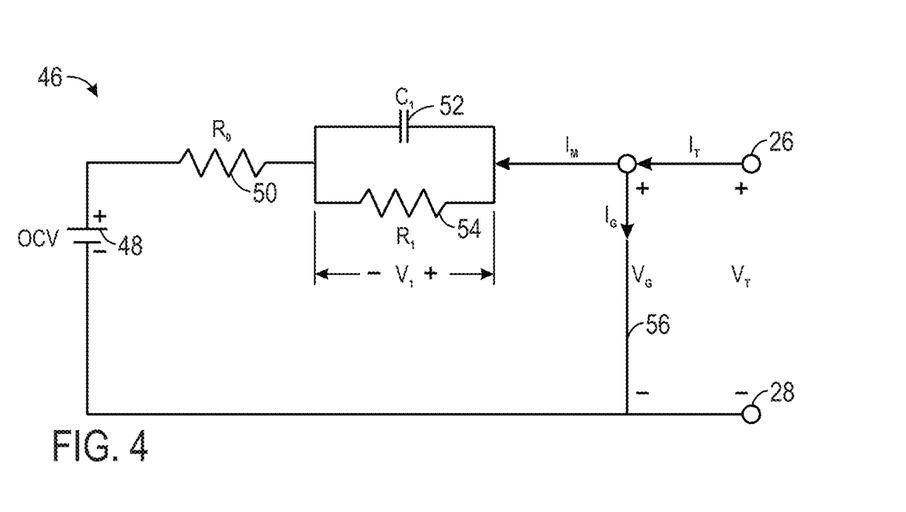
FIG. 4 is a circuit diagram of a model of the lead-acid battery system depicted in FIG. 3, in accordance with an embodiment of the present approach.

To facilitate quantifying the gassing reaction, a battery module model 46, as depicted in FIG. 4, may be utilized to generally model the operation of the battery module 14. More specifically, the battery model 46 is an equivalent circuit model, which utilizes the bulk properties of the battery to simulate the battery dynamics. provide a valuable tradeoff in terms of function accuracy. From an electrical perspective, the battery module 14 may be represented as an electrical device with a source, resistances, and capacitance. As such, the battery module model 46 describes the open-circuit voltage (OCV), the internal resistance, and the non-linear impedance (e.g., charge-transfer, double layer capacitance, and diffusion dynamics) in the battery module 14. For example, in the depicted embodiment, the open-circuit voltage is represented by ideal battery 48, the internal resistance is represented by resistor $R_0$ 50, and the non-linear impedance is represented by capacitor $C_1$ 52 and resistor $R_1$ 54.

Accordingly, based on the battery module model 46, the terminal voltage (e.g., $V_t$) may be described as follows:

$$V_t(k)=OCV(k)+I_m(k)R_0(k)+V_1(k) \quad (2)$$

where $V_t(k)$ is the terminal voltage at time k, OCV(k) is the open-circuit voltage at time k, $I_m(k)$ is the main current at time k, $R_0$ is the internal resistance at time k, and $V_1(k)$ is the voltage drop due to the non-linear impedance at time k. As described above, the sensors 34 may measure the terminal voltage (e.g., $V_t$). Accordingly, as used herein, equation (2) is referred to as a measurement model.

In other words, the terminal voltage of the battery module 14 may be estimated based on the open circuit voltage of the battery module, the voltage drop due to the internal resistance (e.g., $I_m R_0$), and the voltage drop due to the nonlinear resistance (e.g., $V_1$). As will be described in more detail below, a state space model may be used to predict the state of charge (SOC) of the battery module and the voltage drop due to the nonlinear resistance. Generally, the state of charge is related to the open-circuit voltage by a nonlinear relationship, which may be determined by empirical testing on the battery module 14. More specifically, in some embodiments, a manufacturer of the vehicle 10 or the battery module 14 may determine the non-linear relationship between the open-circuit voltage and the state of charge based on empirical laboratory testing in a controlled environment. For example, the manufacturer may charge the battery module 14 to 100% state of charge and gradually discharge the battery module 14 while counting the coulombs that are discharged by the battery module 14 using highly accurate sensors to determine the state of charge. As the battery module 14 is gradually discharged, the manufacturer may also measure the open-circuit voltage of the battery module. Thus, the manufacturer may determine the non-linear relationship between open-circuit voltage and the state of charge as a curve and store the curve in memory 38 of the battery control module 32. Similarly, the internal resistance may also be determined by empirical laboratory testing on the battery module 14, for example, based on temperature and state of charge of the battery module. Thus, to determine the voltage drop due to the internal resistance, the current actually used to charge the battery module 14 may be determined (e.g., main current).

As described above, the battery module 14 may be charged when current flows into the first terminal 14. However, not all of the terminal current may be used to charge the battery module 14. Instead, some of the terminal current may be wasted due to the gassing reaction. Accordingly, to facilitate determining the main current, the battery module model 46 also includes a gassing branch 56 to quantify the gassing reaction. More specifically, as depicted, the terminal current (e.g., $I_t$) is split between the main current (e.g., $I_m$) that is actually used to charge the battery module 14 and the gassing current (e.g., $I_g$). Thus, instead of merely counting the coulombs that flow into and out of the battery module, the techniques described herein take into account the gassing reaction to determine the amount of current actually used to charge the battery module when determining the state of charge of the battery module 14.

As such, determining the gassing current (e.g., $I_g$) may enable the determination of the current actually used to charge the battery module 14 (e.g., main current). In some embodiments, the gassing current at time k may be described as follows:

$$I_g(k)=V_g(k-1)G_{P0}\exp[V_g(k-1)/V_{t0}+A_g(1-\theta(k-1)/\theta_f)] \quad (3)$$

where $I_g(k)$ is the gassing current at time k, $V_g(k-1)$ is the voltage drop across the gassing branch 56 at time k−1, $V_{t0}$ is the terminal voltage above which the gassing reaction takes place (e.g., gassing voltage), $\theta(k-1)$ is the temperature of the battery module at time k−1, $\theta_f$ is freezing temperature of the electrolyte 44, and $G_{P0}$ and $A_g$ are tuning parameters. Additionally, based on the battery module model 46, since the gassing branch 56 is parallel to the terminals, the voltage drop across the gassing branch 56 (e.g., $V_g$) is equal to the terminal voltage (e.g., $V_t$). Thus, equation (3) may be rewritten as follows:

$$I_g(k)=V_t(k-1)G_{P0}\exp[V_t(k-1)/V_{t0}+A_g(1-\theta(k-1)/\theta_f)] \quad (4)$$

where $I_g(k)$ is the gassing current at f me k, $V_t(k-1)$ is the terminal voltage at time k−1, $V_{t0}$ is gassing voltage, $\theta(k-1)$ is the temperature of the battery module at time k−1, $\theta_f$ is freezing temperature of the electrolyte 44, and $G_{P0}$ and $A_g$ are tuning parameters. In other words, the gassing current (e.g., $I_g$) may be determined based on the terminal voltage (e.g., $V_t$) measured at the previous time step and the temperature of the battery module (e.g., $\theta$) measured at the previous time step. Accordingly, as used herein, equation (3) and equation (4) are generally referred to as the gassing current model.

Thus, since the gassing current model enables the gassing current to be quantified, the main current may be determined based at least in part on the gassing current model. One embodiment of a process 58 for determining the main current is described in FIG. 5. Generally, the process 58 includes training the gassing current model (process block 60), determining the gassing current (process block 62), and determining the main current (process block 64). In some embodiments, process 58 may be performed by one or more computing devices (e.g., a computer and/or the battery control module 32) by executing computer-readable instructions stored in tangible non-transitory memory (e.g., memory 38) with a processor (e.g., processor 36) in the computing devices.

Figure 5:
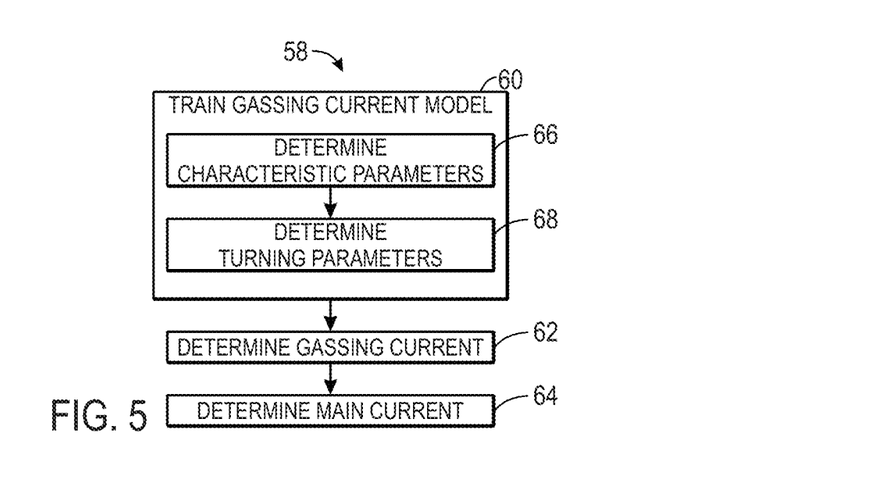
FIG. 5 is a flow diagram of a process for determining the actual amount of current used to charge the lead-acid battery system depicted in FIG. 3, in accordance with an embodiment of the present approach.

In some embodiments, the gassing current model may be trained by a manufacturer of the battery module 14 or the vehicle 10. More specifically, training the gassing current model may include determining the parameters in the gassing current model such that the gassing current may be determined based on the terminal voltage and temperature of the battery module (process block 60). For example, based on the gassing current model described above, training the gassing current model may include determining the gassing voltage (e.g., $V_{r0}$), the freezing temperature of the electrolyte 44 (e.g., $\theta_f$), and the tuning parameters (e.g., $G_{P0}$ and $A_g$). As used herein, since the terminal voltage above which the gassing reaction takes place and the freezing temperature of the electrolyte 44 are characteristics of the battery module 14, they are generally referred to as characteristic parameters. In other words, training the gassing current model includes determining the characteristic parameters (process block 66) and determining the tuning parameters (process block 68).

In some embodiments, the manufacturer may determine the characteristic parameters by running empirical tests on the actual battery module (process block 66). For example, the manufacturer may determine the freezing temperature of the electrolyte 44 by gradually reducing the temperature until the electrolyte 44 freezes. Similarly, the manufacturer may determine the gassing voltage of the battery module 14 by gradually increasing the terminal voltage until the water in the electrolyte beings to dissociate. Additionally or alternatively, the manufacturer may determine the characteristic parameters based on known characteristics of the components in the battery module 14. For example, the freezing point and the gassing voltage may be known for a battery using a lead-acid chemistry.

Additionally, the manufacturer may determine the tuning parameters through various parameter fitting techniques, such as a Kalman filter (process block 68). More specifically, in some embodiments, the manufacturer may run a training sequence that systematically changes the operational parameters (e.g., terminal voltage, terminal current, and temperature) of the battery module 14 and determines the corresponding gassing current as the parameters change. For example, in a controlled testing environment, a manufacturer may charge the battery module 14 to 100% state of charge. After the battery module is at 100% state of charge, current may be supplied to the battery module to determine a relationship between the gassing current at time k, the terminal voltage at time k−1, and the temperature at time k−1. More specifically, since the battery module 14 is at 100% state of charge, all of the current supplied to the battery module 14 will go into the gassing branch 56 and thus be equal to the gassing current. Accordingly, the gassing model may be trained by adjusting the tuning parameters to accurately describe the relationship between the gassing current, terminal voltage, and temperature. In some embodiments, the manufacturer may train the gassing current model offline and store the trained model in the memory 38 of the battery control module 32, for example, as a calibration table.

As such, the battery control module 32 may determine the gassing current based at least in part on the measured terminal voltage and battery module temperature (process block 62). More specifically, the battery control module 32 may receive the terminal voltage and temperature from the sensors 34 and the processor 36 may input the terminal voltage and temperature into the gassing current model to determine the gassing current. Once the gassing current is determined, it may also be stored in the memory 38 of the battery control module 32.

As described above, the battery control module 32 may then determine the main current based at least in part on the gassing current (process block 64). More specifically, the battery control module 32 may receive the terminal current from the sensors 34 and the processor 36 may subtract the gassing current from the terminal current to determine the main current. Once the main current is determined, it may also be stored in the memory of the battery control module 32, for example, for use in the measurement model. In other words, since the measurement model is based on the gassing current determined via the gassing current model, the measurement model is a model that includes another model (e.g., gassing current model).

As will be described in more detail below, the measurement model may be used to facilitate determining the state of the battery module 14 including the battery module's state of charge (SOC). One embodiment of a process 70 for determining the state of the battery module 14 is described in FIG. 6. Generally, the process 70 includes developing a state space model (process block 72), developing a measurement estimation model (process block 74), initializing the state of the battery and uncertainty (process block 76), recursively determining the state of the battery (process block 78), and controlling operation of the vehicle based on the state of the battery (process block 80). In some embodiments, the process 70 may be performed by one or more computing devices (e.g., a computer and/or the battery control module 32) by executing computer-readable instructions stored in tangible non-transitory memory (e.g., memory 38) with a processor (e.g., processor 36) in the computing devices.

Figure 6:
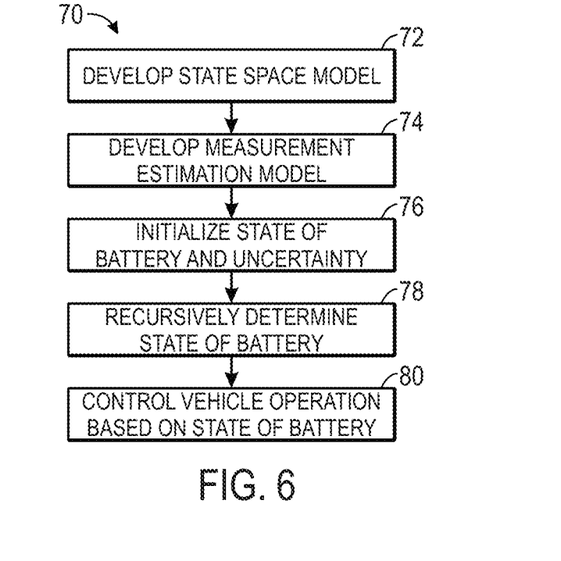
FIG. 6 is a flow diagram of a process for controlling vehicle operation based on a state of the lead-acid battery system depicted in FIG. 3, in accordance with an embodiment of the present approach.

In some embodiments, the state space model estimation model may be developed by a manufacturer of the vehicle 10 or the battery module 14 (process block 72). Generally, the state space model may take the following form:

$$\hat{x}_{\bar{k}} = A\hat{x}_{k-1} + Bu_k \tag{5}$$

where $\hat{x}_{\bar{k}}$ is the predicted state of the battery at time k, $\hat{x}_{k-1}$ is the corrected state of the battery at time k−1, $u_k$ is an input parameter of the battery at time k, and A and B are general form matrices. Accordingly, developing the state space model (e.g., equation (5)) may include determining the A and B matrices. For example, the manufacturer may determine the matrices based on lab testing, simulation models, empirical data, mathematical models, or the like. Additionally, in some embodiments, the state space model may be developed offline and stored in memory 38 of the battery control module 32.

Similarly, the measurement estimation model may also be developed by a manufacturer of the vehicle 10 or the battery module 14 (process block 74). As described above, the measurement estimation model (e.g., equation (2)) enables the terminal voltage to be determined based on the state of the battery (e.g., state of charge and voltage drop due to non-linear impedance) and the main current. Accordingly, the measurement estimation model may be rewritten as follows:

$$V_t(k) = H\hat{x}_{\bar{k}} + I_m(k)R_0(k) \tag{6}$$

where $V_t(k)$ is the estimated terminal voltage at time k, $\hat{x}_{\bar{k}}$ is the predicted state of the battery at time k, $I_m$ is the main current at time k, $R_0$ is the linear resistance at time k, and H is a general form matrices. Accordingly, developing the measurement estimation model (e.g., equation (6)) may include determining the H matrix. For example, the manufacturer may determine the matrix based on lab testing, simulation models, empirical data, or the like. Additionally, in some embodiments, the measurement estimation model may be developed offline and stored in memory 38 of the battery control module 32.

Based on the state space model described above (e.g., equation (5)), the predicted state of the battery is determined based on the previous corrected state of the battery. Additionally, as will be described in more detail below, the uncertainty of the predicted state of the battery is based on the previous uncertainty. As such, an initial state of the battery and initial uncertainty may be determined (process block 76). For example, to determine the initial state of the battery, the battery module 14 may be fully charged so that the initial state of charge will be 100%. Additionally or alternatively, the battery module 14 may be fully discharged so that the initial state of charge will be 0%. Accordingly, since the initial state of the battery is known, the initial uncertainty may generally be described by $I_{n \times n}$, where n is the number of states and parameters in the state of the battery vector. Additionally, in some embodiments, the initialized state of the battery and the initial uncertainty may be stored in memory 38 of the battery control module 32. Moreover, in some embodiments, the battery control module 32 may periodically re-initialize (e.g., calibrate) the state of charge, for example, by fully charging the battery module and initializing the state of charge as 100%.

As will be described in more detail below, the battery control module 32 may then recursively determine the state of the battery (process block 88). For example, in some embodiment, the state space model and the measurement model, which includes the gassing current model, may be used in a Kalman filter. More specifically, recursively determining the state of the battery may include predicting the state of the battery, determining the uncertainty of the predicted state, predicting an operational parameter of the battery, measuring the operational parameter of the battery, determining the error between the predicted and measure operational parameter, minimizing the error, determining the corrected state of the battery, and determining the corrected uncertainty of the predicted state. Based on the techniques described herein, it is emphasized that the accuracy of the determined state of the battery is improved by recursively taking into account the gassing reaction that may take place in each time step.

Based on the determined state of the battery, the vehicle control module 30 and/or the battery control module 32 may control operation of the vehicle 10 (process block 80). More specifically, the operation of the vehicle 10 may be controlled for discrete time steps. For example, the vehicle control module 30 may control the operation of the vehicle during time step from k to k+1 based at least in part on the state of the battery determined at time k.

As described above, the battery control module 32 may be included in the vehicle control module 30, as a discrete module, or included in the battery module 14. Accordingly, in some embodiments, the battery control module 32 may communicate the state of the battery to the vehicle control module 30 for each time step. For example, the battery control module 32 may store the determined battery state in memory of the vehicle control module 30.

Additionally, as described above, the state of the battery (e.g., state of charge of the battery) may be used to facilitate stable operation of a vehicle 10 especially when the vehicle performs auto-stop operations. One of ordinary skill in the art should understand that the method each vehicle 10 uses the battery state information depends on the specific auto-stop algorithm implemented by the vehicle. Accordingly, the following example operations are merely intended to illustrate possible variations in auto-stop algorithms that utilize the battery state information.

Generally, an auto-stop algorithm may use the state of charge (SOC) of a battery module 14 to determine the ability of the battery module 14 to supply power to the electrical systems in the vehicle 10. For example, the vehicle control module 30 may determine whether to disable the internal combustion engine 18 when the vehicle idles based on the ability of the battery module 14. More specifically, in some embodiments, the vehicle control module 30 may only disable the internal combustion engine 18 when it is determined that the battery module 14 will be able to supply all of the electrical power required by the vehicle 10. To facilitate determining the electrical power required by the vehicle 10, the vehicle control module 18 may determine what electrical systems are currently in use. Additionally or alternatively, the vehicle control module 18 may keep track of the electrical power requirements over time.

Additionally, the vehicle control module 30 may determine when to restart a disabled internal combustion engine 18 based on the ability of the battery module 14. More specifically, in some embodiments, the vehicle control module 30 may restart the internal combustion engine 18 when it is determined that the battery module 14 is not able to supply all of the electrical power required by the vehicle 10. Additionally or alternatively, the vehicle control module 30 may restart the internal combustion engine when it is determine that the battery module state of charge reaches a certain state of charge threshold. For example, the vehicle control module 30 may restart the internal combustion engine 18 as soon as the state of charge of the battery module 14 reaches 75%. In some embodiments, the state of charge threshold may be set to prolong the life of the battery module 14 by controlling the depth of discharge. Moreover, the state of charge threshold may be set such that some amount of error in the state of charge determination will not affect the stability of the vehicle 10.

Furthermore, the vehicle control module 30 may control the charging of the battery module 14. For example, in some embodiments, the vehicle control module 30 and/or the battery control module 32 may control the voltage at which the battery module 14 is charged. More specifically, when the battery state of charge is low, the battery module 14 may be charged with a higher voltage to improve the charging time of the battery module. On the other hand, when the battery state of charge is high, charging with a higher voltage may increase the amount of gassing the battery module 14. Accordingly, the charging voltage may be higher when the state of charge is low and decreased as the state of charge increases. Additionally, in some embodiments, the vehicle control module 30 and/or the battery control module 32 may optimize the charging of the battery module 14. For example, when the battery state of charge is at 100%, the coulombic efficiency of the battery module 14 goes to zero because no more energy can be stored. As such, charging of the battery module 14 may cease when the battery state of charge is at or nears 100%. Additionally, the vehicle control module 30 and/or the battery control module 32 may maintain the battery state of charge within a desired range. For example, the battery control module 32 may maintain the battery state of charge at a partial state of charge between 80-100%. In other words, the accurate determination of the state of a battery enables the vehicle control module 30 and/or the battery control module 32 to assert more control over operation of the battery module.

Based on the auto-stop algorithms described above, it is emphasized that, the techniques described herein enable the fuel economy of the vehicle 10 to be increased and the emissions of the vehicle 10 to be decreased. More specifically, since the state of charge may be determined with less error by accounting for the gassing reaction, the internal combustion engine 18 may remain disabled for longer periods of time without jeopardizing vehicle stability. For example, the state of charge threshold may be set lower because the threshold will need to account for less error in the determined state of charge. In fact, the stability of the vehicle operation itself may further be improved due to the higher accuracy of the determined state of charge. Similarly, the battery module 14 may be more efficiently charged by charging at a more ideal voltage and/or minimizing the amount of energy wasted by a gassing reaction. Comparatively, as will be illustrated below, other techniques may allow the state of charge determination to drift as error due to the gassing reaction accumulate over time.

As described above, to enable the accurate state of charge determination, the gassing reaction that may take place in the battery module 14 is recursively accounted for in the state of charge determined at each time step. One embodiment of a process 88 for recursively determining the state of the battery is described in FIG. 7. Generally, the process 78 includes predicting the state of the battery (process block 82), determining the uncertainty of the predicted state (process block 84), predicting the terminal voltage of the battery (process block 86), measuring the terminal voltage of the battery (process block 88), determining error between the predicted and measured terminal voltage (process block 90), minimizing the error (process block 92), determining the corrected state of the battery (process block 94), and determining the corrected uncertainty of the predicted state (process block 96). Additionally, the process 78 may continue recursively based on the previous time step (arrow 98). In other words, the process 78 may run online (e.g., in real-time or in parallel) with the operation of the vehicle 10. In some embodiments, the process 78 may be performed automatically and/or continuously by the battery control module 32 by executing computer-readable instructions stored in tangible non-transitory memory 38 with the processor 36.

Figure 7:
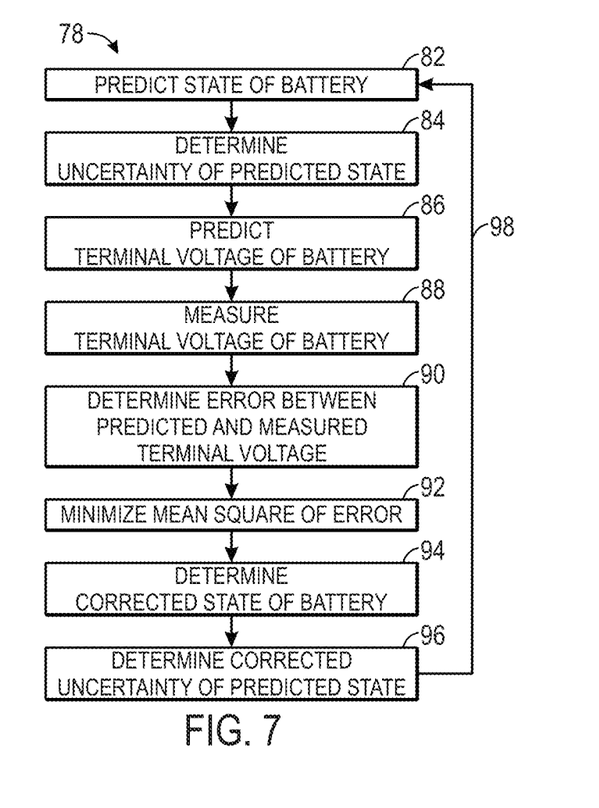
FIG. 7 is a flow diagram of a process for recursively determining the state of the lead-acid battery system depicted in FIG. 3 including a corrected state of charge (SOC), in accordance with an embodiment of the present approach.

Accordingly, in some embodiments, the battery control module 32 may predict the state of the battery module via the state space model (process block 82). As described above, the state space model (e.g., equation (5)) predicts a state of the battery at time at time k based on the corrected state of the battery at time k−1 and an operational parameter of the battery at time k−1. In some embodiments, the state space model (e.g., A and B matrices), the previous corrected state, and the previous operational parameter may be stored in the memory 38 of the battery control module 32. Thus, the processor 36 may retrieve and input them into the state space model to predict the state of the battery at time k. More specifically, in some embodiments, the state space model may predict the state of charge (SOC) and the voltage drop due to the non-linear impedance (e.g., $V_1$) at time k. Additionally, the processor 36 may then store the predicted state of the battery in memory 38.

The battery control module 32 may then determine the uncertainty (e.g., covariance) of the predicted stated of the battery (process block 84). Generally, the predicted uncertainty may be determined as follows:

$$P_{\bar{k}} = A P_{k-1} A^T + Q \quad (7)$$

where $P_{\bar{k}}$ is the predicted uncertainty of the battery state at time k, $P_{k-1}$ is the corrected uncertainty of the battery state at time k−1, Q and A are general form matrices. More specifically, Q may represent the system noise and may be hand tuned based on empirical data. In some embodiments, the predicted uncertainty relationship (e.g., Q and A matrices) and the previous corrected uncertainty may be stored in the memory 38 of the battery module 32. Thus, the processor 36 may retrieve input them into equation (7) to predict the uncertainty of the battery state at time k. Additionally, the processor 36 may then store the predicted uncertainty in memory 38.

Additionally, the battery control module 32 may predict the terminal voltage of the battery using the measurement model (process block 86). For example, based on the measurement model (e.g., equation (2)), the battery control module 32 may predict the terminal voltage based on the open-circuit voltage, the voltage drop due to the internal resistance, and the voltage drop due to the non-linear impedance. More specifically, since the predicted battery state may include the voltage drop due to the non-linear impedance and the predicted state of charge, the processor 36 may determine the open-circuit voltage by inputting the predicted state of charge into the determined non-linear relationship between open-circuit voltage and state of charge. Furthermore, the processor 36 may determine the voltage drop due to the internal resistance using the gassing current model described above. Thus, the processor 36 may input the voltage drop due to the non-linear impedance (e.g., $V_1$), the open-circuit voltage determined based on the predicted state of charge (e.g., OCV), and the main current determined based on the gassing current model (e.g., $I_m$) into the measurement model to determine the predicted terminal voltage (e.g., $V_t$).

To determine the error of the predicted terminal voltage, the battery control module 32 may also receive the terminal voltage measured by the sensors 34 (process block 88) and find the difference between the predicted and measured terminal voltages (process block 90). More specifically, the processor 36 may subtract the predicted terminal voltage from the measured terminal voltage and store the difference in memory 38.

The battery control module 32 may then minimize the mean square of the error (process block 92). Minimizing the mean square of the error improves the accuracy of the predicted state of the battery. Generally, the mean square of the error may be minimized with the following equation:

$$K_k = P_{\bar{k}} H^T (H P_{\bar{k}} H^T + R)^{-1} \quad (8)$$

where $K_k$ is the gain (e.g., signal to noise ratio) at time k, $P_{\bar{k}}$ is the predicted uncertainty of the battery state at time k, and H and R are general form matrices. More specifically, R may represent the environment noise and may be hand tuned based on empirical data. In some embodiments, the gain equation (e.g., H and R matrices) and the predicted uncertainty may be stored in the memory 38 of the battery control module 32. Thus, the processor 36 may retrieve and input them into equation (8) to determine the gain that minimizes the mean square of the error. Additionally, the processor 36 may store the gain in the memory 38. More generally, the battery control module 32 may minimize the error between the measured terminal voltage and the predicted terminal voltage.

Based on the determined gain, the battery control module 32 may determine the corrected state of the battery (process block 94). More specifically, the battery control module 32 may correct the predicted battery state using the gain. Generally, the corrected state of the battery may be determined at follows:

$$\hat{x}_k = \hat{x}_{\bar{k}} + K_k (z_k - H \hat{x}_{\bar{k}} - I_m(k) R_0(k)) \quad (9)$$

where $\hat{x}_k$ is the corrected state of the battery at time k, $\hat{x}_{\bar{k}}$ is the predicted state of the battery at time k, $K_k$ is the gain at time k, $z_k$ is the measured terminal voltage at time k, $I_m$ is the main current at time k, $R_0$ is the linear resistance at time k, and H is a general form matrix. In some embodiments, the corrected state of the battery equation (e.g., H matrix), the measured terminal voltage, the gain, and the predicted battery state may be stored in the memory 38 of the battery control module 32. Thus, the processor 36 may retrieve and input them into equation (9) to determine the corrected state of the battery. Additionally, the processor 36 may store the corrected state of the battery in memory 38.

Furthermore, the battery control module 32 may determine the corrected uncertainty of the predicted state for use in the next time step (process block 96). Generally, the corrected uncertainty may be determined as follows:

$$P_k = (I - K_k H) P_{\bar{k}} \quad (10)$$

where $P_k$ is the corrected uncertainty at time k, $K_k$ is the gain at time k, $P_{\bar{k}}$ is the predicted uncertainty of the battery state at time k, I is the identity matrix, and H is a general form matrix. In some embodiments, the gain, the predicted uncertainty, and the corrected uncertainty equation (e.g., I and H matrices) may be stored in the memory 38 of the battery control module 32. Thus, the processor 36 may retrieve the gain and the predicted uncertainty and input them into equation (10) to determine the corrected uncertainty of the predicted state. Additionally, the processor 36 may store the corrected uncertainty in memory 38 for use in the next time step.

Process 78 then repeats for the next time step (arrow 98). In the next time step (e.g., k+1), the battery control module 32 predicts the state of the battery at time step k+1 based on the corrected state of the battery at time step k and the corrected uncertainty of the battery state at time step k. Thus, since the corrected state of the battery and the correct uncertainty of the battery state takes into account the gassing reaction, the state of the battery determined for time k+1 will be based on the gassing reaction quantified for the previous time steps as well as at time k+1. In other words, the accuracy of the state of charge determination is improved by taking into account the gassing reaction for the current as well as previous time steps. To help illustrate the improved accuracy, a specific example is described below.

Specific Example

The example described below is based on a 95 Ah Absorbent Glass Mat (AGM) lead-acid battery. Based on that battery, the state space model for time k may be defined as follows:

$$\begin{bmatrix} SOC(k) \\ V_1(k) \end{bmatrix} = \begin{bmatrix} 1 & 0 \\ 0 & \exp(-\Delta t/R_1 C_1) \end{bmatrix} \begin{bmatrix} SOC(k-1) \\ V_1(k-1) \end{bmatrix} + \begin{bmatrix} \eta \Delta t / \text{Capacity} \\ R_1(1 - \exp(-\Delta t/R_1 C_1)) \end{bmatrix} I_m(k) \quad (11)$$

where SOC is the state of charge, $V_1$ is the voltage drop due to non-linear impedance, $I_m(k)$ is the main current at time k, $R_1$ and $C_1$ are the non-linear impedance from the battery model 46, $\Delta t$ is the change in temperature from time k−1 to time k, and $\eta$ is the electrical efficiency of the battery module 14 (e.g., useful power output/useful power input). Based on the state space model describe in equation (11), the state of the battery at time k (e.g., state of charge and non-linear voltage drop) may be estimated based on the state of the battery and the main current (e.g., $I_m$) at time k−1.

Additionally, the measurement for time k may be defined as follow:

$$OCV(k) = f(SOC(k), \theta(k)) \quad (12)$$

$$V_t(k) = \begin{bmatrix} 1 & 1 \end{bmatrix} \begin{bmatrix} OCV(k) \\ V_1(k) \end{bmatrix} + I_m(k) R_0(k) \quad (12b)$$

where OCV(k) is the open-circuit voltage at time k, $\theta(k)$ is the temperature at time k, $V_t(k)$ is the terminal voltage at time k, f(x,y) is the non-linear relationship between open-circuit voltage and state of charge, $V_1(k)$ is the non-linear voltage drop at time k, $I_m(k)$ is the main current at time k, and $R_0(k)$ is the linear resistance at time k.

Figure 8A:
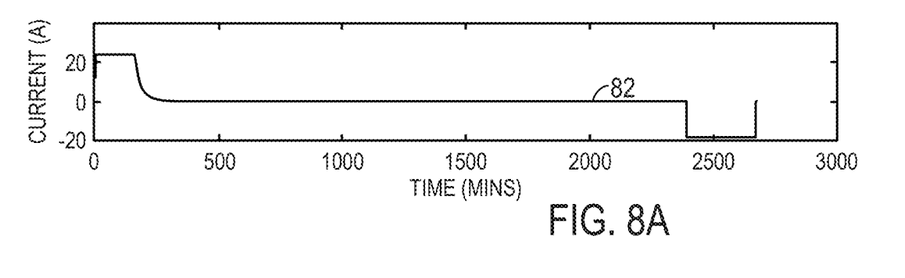
FIG. 8A is a graph describing terminal current for the lead-acid battery system depicted in FIG. 3, in accordance with an embodiment of the present approach.
Figure 8B:
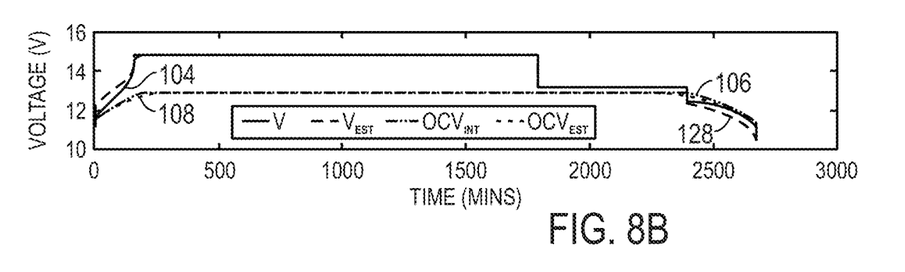
FIG. 8B is a graph describing measured terminal voltage, estimated terminal voltage, open-circuit calculated based on techniques described herein for the lead-acid battery system depicted in FIG. 3, in accordance with an embodiment of the present approach.

Thus, the state of the battery (e.g., state of charge) may be determined using the state space model described in equation (11) and the measurement model described in equation (12). To help illustrate, the state of battery is determined based on a charge/discharge profile applied to the battery module 14 between 0 to approximately 2700 minutes, as described in FIGS. 8A-8C. More specifically, FIG. 8A describes the terminal current 100; FIG. 8B describes the actual (e.g., measure) terminal voltage 102 (solid line), the predicted terminal voltage 104, the open-circuit voltage determined solely using coulomb counting 106, and the open-circuit voltage determined using the techniques described herein 108; and FIG. 8C describes the state of charge (SOC) determined solely using coulomb counting 110 and the state of charge (SOC) determined using the techniques described herein 112.

Generally, the charge/discharge profile includes charging the battery from 0 to approximately 1700 minutes, resting (e.g., not charging or discharging) the battery from approximately 1700 minutes to approximately 2400 minutes, and discharging the battery from approximately 2400 minutes to approximately 2700 minutes. Based on such a charging profile, the terminal current 100 should be positive until the battery reaches 100% state of charge and then drop to approximately zero amps until the battery begin discharging, at which point the terminal current 100 should go negative. As depicted in FIG. 8A, the terminal current 100 is 25 amps between approximately 0 to 200 minutes, very small (e.g., almost zero amps) between approximately 200 to 2400 minutes, and −20 amps between approximately 2400 to 2700 minutes. Additionally, as depicted in FIG. 8B, the terminal voltage 102 gradually increases to 15 volts between approximately 0 to 200 minutes, remains at 15 volts between approximately 200 to 1700 minutes, drops to 13.3 volts between approximately 1700 to 2400 minutes, and gradually decreases between approximately 2400 minutes to 2700 minutes.

Accordingly, based on the described charge/discharge profile the state of charge of the battery should increase until it reaches 100% at approximately 200 minutes, remain at 100% between approximately 200 to 2400 minutes, and decrease between approximately 2400 to 2700 minutes. Additionally, since the open-circuit voltage is related to the battery state of charge, the open-circuit voltage should also increase until reaching its maximum value at 200 minutes, remain at the maximum value between approximately 200 minutes to 2400 minutes, and decrease between approximately 2400 to 2700 minutes.

Figure 8C:
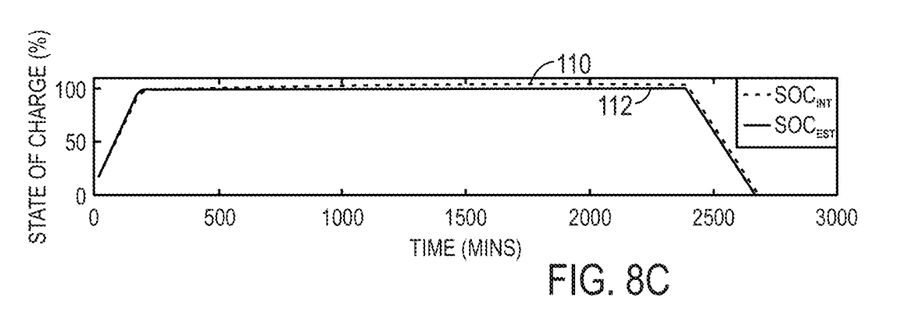
FIG. 8C is a graph describing state of charge (SOC) calculated based on coulomb counting and state of charge (SOC) calculated based on techniques described herein for the lead-acid battery system depicted in FIG. 3, in accordance with an embodiment of the present approach.

As depicted in FIG. 8B, both calculated open-circuit voltages 106 and 108 generally match the expected results described above. In fact, there is very little variation between the open-circuit voltage 106 and open-circuit voltage 108. Additionally, as depicted in FIG. 8C, the state of charge 112 determined using the techniques described herein also closely matches the expected results described above. On the other hand, it is quite visible that the state of charge 110 determined solely using coulomb counting contains an error. More specifically, as depicted, the state of charge 110 actually goes above 100% state of charge. By definition, going above 100% state of charge should not be possible. The cause of this unexpected result is due to the gassing reaction (e.g., dissociation of water) in the battery module 14.

More specifically, as described above, the gassing reaction may consume electrons in the battery module 14. Accordingly, when the battery is charged even after the battery is at 100% state of charge (e.g., top charged), gassing may occur in the battery module 14, which consumes current. As such, current may flow into the battery module 14 even when it is not being used to charge the battery module 14. In other words, between approximately 200 to 1700 minutes the terminal current may be slightly above zero amps. Thus, solely using a coulomb counting will count such current when determining the state of charge, which may cause unexpected results in the state of charge (e.g., state of charge above 100% or errors).

Moreover, even after the battery module 14 is no longer being top charged, the unexpected results will be carried through because the coulombs will continue to integrate. For example, as depicted in FIG. 8C, the state of charge 110 remains above 100% even after the battery is no longer being charged (e.g., between 1700 to 2400 minutes). In fact, the state of charge 110 remains slightly higher than the state of charge 112 determined using the techniques described herein for the remainder of the charge/discharge cycle (e.g., approximately 1700 to 2400 minutes). Thus, over an even longer charge/discharge cycle (e.g., operation of the vehicle 10) unexpected results (e.g., errors) may continue to add on top of one another, which may cause the state of charge 110 determined solely using coulomb counting to drift over time, particularly when the battery module 14 is repeatedly top charged. Comparatively, since the techniques described herein take into account the gassing reaction (e.g., dissociation of water), unexpected results are not present in state of charge 112.

As described above, the terminal voltage (e.g., $V_{est}$) may be predicted based at least in part on the state of charge of the battery. In the depicted embodiment, the predicted terminal voltage 104 closely matches the actual terminal voltage 102. In fact, between approximately 200 to 2400 minutes, the predicted terminal voltage 104 is essentially the same as the actual terminal voltage 102, even when the terminal voltage changes at approximately 1700 minutes. It is recognized that when the battery module 14 is actually charging (e.g., between approximately 0 to 200 minutes) and discharging (e.g., between approximately 2400 to 2700 minutes), the predicted terminal voltage 104 slightly lags the actual terminal voltage 102. However, such results may be reduced by using higher order (e.g. more accurate) models (e.g., battery model 46, gassing current model, measurement model, and/or state space model).

Moreover, the presently described embodiment further illustrates how improving the state of charge determination may increase fuel efficiency and/or reduce emissions. More specifically, in some embodiments, since the gassing reaction may continue to consume energy even though the battery module 14 is not being charged, the vehicle control module 30 and/or the battery control module 32 may cease charging once the battery module 14 reaches or nears 100% state of charge. For example, the vehicle control module 30 may disconnect the alternator 20 and put the vehicle 10 into passive boost further increasing the fuel efficiency and/or reducing emissions.

Technical effects provided by the techniques described herein include improving the accuracy of the state of charge (SOC) determination for a battery system, such as a lead-acid battery system, by taking into account gassing reactions that may take place in the battery system. More specifically, the gassing reaction may be quantified via a gassing current model, which enables the amount of current actually used to charge the battery system to be determined With the improved accuracy of the state of charge, the stability of vehicle operation may be improved because there will be less error in the determined state of charge. Additionally, since the state of charge may be determined with more certainty, the fuel efficiency may be increased and the emissions may be decreased because the internal combustion engine 18 may be disabled for longer periods of time without potentially jeopardizing vehicle operation stability. As such, this may provide more efficient use of energy.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A method, comprising:
    predicting terminal voltage of a battery module in a vehicle using a battery control module, wherein predicting the terminal voltage comprises:
        determining a gassing current of the battery module using a gassing current model, wherein the gassing current quantifies terminal current that is not used to charge the battery module; and
        calculating the predicted terminal voltage based at least in part on a measurement model and the determined gassing current;
    measuring terminal voltage of the battery module using a sensor communicatively coupled to the battery control module;

determining a corrected state of the battery module using the battery control module by minimizing error between the predicted terminal voltage and the measured terminal voltage; and controlling operation of the vehicle using a vehicle control module based at least in part on the corrected state of the battery module, wherein the corrected state of the battery module comprises a state of charge of the battery module.

2. The method of claim 1, comprising predicting a state of the battery module using the battery control module based at least in part on a state space model, a corrected state of the battery module determined in a prior time step, and an operational parameter of the battery module determined in the prior time step, wherein the predicted terminal voltage is calculated based at least in part on the predicted state of the battery module.

3. The method of claim 2, comprising determining uncertainty of the predicted state of the battery module using the battery control module, wherein the corrected state of the battery module is determined based at least in part on the determined uncertainty of the predicted state of the battery module.

4. The method of claim 2, comprising determining a corrected uncertainty of the predicted state of the battery module, wherein the corrected uncertainty is used to determine uncertainty of a predicted state of the battery module in a subsequent time step.

5. The method of claim 1, wherein predicting the terminal voltage comprises:

measuring the terminal current using the sensor communicatively coupled to the battery control module; and determining amount of current actually used to charge the battery module by subtracting the gassing current from the terminal current.

6. The method of claim 1, wherein the battery module is a lead-acid battery module and the gassing current model models a gassing reaction that takes place in the lead-acid battery module.

7. The method of claim 6, wherein the gassing reaction is dissociation of water into oxygen and hydrogen gas in an electrolyte of the lead-acid battery module.

8. The method of claim 1, comprising training the gassing current model by determining characteristic parameters and tuning parameters of the gassing current model offline from vehicle operation.

9. The method of claim 1, comprising determining a subsequent corrected state of the battery module based at least in part on the corrected state of the battery module.

10. A tangible, non-transitory, computer-readable medium storing a plurality of instructions executable by a processor of a battery control module in a vehicle, the instructions comprising instructions to:

predict terminal voltage of a battery module in the vehicle using the processor, wherein the instruction to predict the terminal voltage comprises instructions to:

determine a gassing current of the battery module using a gassing current model, wherein the gassing current quantifies terminal current that is not used to charge the battery module; and calculate the predicted terminal voltage using a measurement model and the determined gassing current;

measure terminal voltage of the battery module using a sensor communicatively coupled to the battery control module;

determine a corrected state of the battery module using the processor by minimizing error between the predicted terminal voltage and the measured terminal voltage; and communicate the corrected state of the battery module to a vehicle control module to enable the vehicle control module to control operation of the vehicle based at least in part on the corrected state of the battery module.

11. The tangible, non-transitory, computer-readable medium of claim 10, wherein the instructions comprise instructions to:

predict a state of the battery module using the processor based at least in part on a corrected state of the battery module determined in a prior time step and an operational parameter of the battery module determined in the prior time step, wherein the predicted terminal voltage is calculated based at least in part on the predicted state of the battery module; and determine uncertainty of the predicted state of the battery module using the processor, wherein the corrected state of the battery module is determined based at least in part on the uncertainty of the predicted state of the battery module.

12. The tangible, non-transitory, computer-readable medium of claim 10, wherein the instructions to predict the terminal voltage comprise instructions to:

measure the terminal current using the sensor communicatively coupled to the battery control module; and determine amount of current actually used to charge the battery module by subtracting the gassing current from the terminal current.

13. The tangible, non-transitory, computer-readable medium of claim 10, wherein the battery module is a lead-acid battery module and the gassing current model quantifies a gassing reaction that takes place in the lead-acid battery module.

14. A vehicle, comprising:

a battery module configured to supply electrical power to electrical systems in the vehicle;

a battery control module configured to recursively determine a corrected state of the battery module using a state space model and a measurement model that predicts an operational parameter of the battery module, wherein the measurement model comprises a gassing current model that enables the battery control module to determine amount of current that is actually used to charge the battery module; and a vehicle control module configured to control operation of the vehicle based at least in part on the corrected state of the battery module.

15. The vehicle of claim 14, wherein the vehicle control module is configured to determine whether to disable an internal combustion engine in the vehicle when the vehicle is idling based at least in part on the corrected state of the battery module.

16. The vehicle of claim 14, wherein the vehicle control module is configured determine when to restart an internal combustion engine disabled during an auto-stop operation based at least in part on the corrected state of the battery module.

17. The vehicle of claim 14, wherein the vehicle control module is configured to determine when to charge the battery module based at least in part on the corrected state of the battery module.

18. The vehicle of claim 14, wherein the vehicle control module is configured to determine at what voltage to charge the battery module based at least in part on the corrected state of the battery module.

19. The vehicle of claim 14, wherein the corrected state of the battery module comprises a corrected state of charge of the battery module.

20. The vehicle of claim 14, wherein the gassing current model quantifies a gassing reaction that takes place in the battery module.

21. The vehicle of claim 20, wherein the battery module is a lead-acid battery module and the gassing reaction is dissociation of water into oxygen and hydrogen gas in an electrolyte of the battery module.

22. A vehicle, comprising:
a battery module configured to supply electrical power to electrical systems in the vehicle;
a battery control module configured to recursively determine a corrected state of the battery module using a state space model and a measurement model that predicts an operational parameter of the battery module, wherein the measurement model comprises a gassing current module that enables the battery control module to determine amount of current that is actually used to charge the battery module; and
an internal combustion engine configured to disable when the vehicle is stationary and to restart when propulsion is desired.

23. A method, comprising:
predicting terminal voltage of a battery module in a vehicle using a battery control module, wherein predicting the terminal voltage comprises:
determining a gassing current of the battery module using a gassing current model, wherein the gassing current quantifies terminal current that is not used to charge the battery module; and
calculating the predicted terminal voltage based at least in part on a measurement model and the determined gassing current;
measuring terminal voltage of the battery module using a sensor communicatively coupled to the battery control module;
predicting a state of the battery module using the battery control module based at least in part on a state space model, a corrected state of the battery module determined in a prior time step, and an operational parameter of the battery module determined in the prior time step, wherein the predicted terminal voltage is calculated based at least in part on the predicted state of the battery module;
periodically calibrating the state space model by fully charging the battery module; and
determining a corrected state of the battery module using the battery control module by minimizing error between the predicted terminal voltage and the measured terminal voltage.

* * * * *

UNITED STATES PATENT AND TRADEMARK OFFICE
CERTIFICATE OF CORRECTION

PATENT NO. : 9,625,533 B2
APPLICATION NO. : 14/253720
DATED : April 18, 2017
INVENTOR(S) : Daniel B. Le et al.

It is certified that error appears in the above-identified patent and that said Letters Patent is hereby corrected as shown below:

On the Title Page

In Item (56), under "OTHER PUBLICATIONS", in Column 2, Line 2, delete "Kahlman" and insert -- Kalman --, therefor.

On Page 2, in Item (56), "U.S. PATENT DOCUMENTS", in Column 1, Line 1, delete "Hoenig" and insert -- Hoenig et al. --, therefor.

On Page 2, in Item (56), under "U.S. PATENT DOCUMENTS", in Column 1, Line 4, delete "Atehortua" and insert -- Atehortua et al. --, therefor.

On Page 2, in Item (56), under "U.S. PATENT DOCUMENTS", in Column 1, Line 6, delete "Atehortua" and insert -- Atehortua et al. --, therefor.

In the Drawings

In the drawing sheets, replace sheet 5 with attached drawing sheet 5 labeled "Replacement Sheet," which corrects clerical and typographical errors in FIGS. 8A and 8B. Specifically, in FIG. 8A, drawing sheet 5 replaces reference numeral "82" with reference numeral "100." Additionally, in FIG. 8B, drawing sheet 5 replaces reference numeral "128" with reference numeral "102," replaces label "V" with label "VEST," and replaces label "VEST" with label "V.".

In the Specification

In Column 2, Line 37, delete "DRAWINGS" and insert -- BRIEF DESCRIPTION OF THE DRAWINGS --, therefor.

In Column 4, Line 28, delete "H20)" and insert -- H2O) --, therefor.

In Column 7, Line 15, delete "dynamics. provide" and insert -- dynamics provide --, therefor.

Signed and Sealed this
First Day of May, 2018

Andrei Iancu
*Director of the United States Patent and Trademark Office*

In Column 7, Line 33, delete "R0" and insert -- R0(k) --, therefor.

In Column 8, Line 4, delete "first terminal 14." and insert -- first terminal 26. --, therefor.

In Column 8, Line 39, delete "t me" and insert -- time --, therefor.

In Column 10, Line 58, delete "Im" and insert -- Im(k) --, therefor.

In Column 10, Line 59, delete "R0" and insert -- R0(k) --, therefor.

In Column 10, Line 60, delete "matrices." and insert -- matrix. --, therefor.

In Column 12, Line 13, delete "vehicle control module 18" and insert -- vehicle control module 30 --, therefor.

In Column 12, Line 15, delete "vehicle control module 18" and insert -- vehicle control module 30 --, therefor.

In Column 15, Line 3, delete "Im" and insert -- Im(k) --, therefor.

In Column 15, Line 4, delete "R0" and insert -- R0(k) --, therefor.

In Column 16, Line 7, delete "(12)" and insert -- (12a) --, therefor.

In Column 18, Line 16, delete "determined With" and insert -- determined. With --, therefor.

In the Claims

In Column 20, Line 60, in Claim 16, delete "configured" and insert -- configured to --, therefor.

FIG. 8A
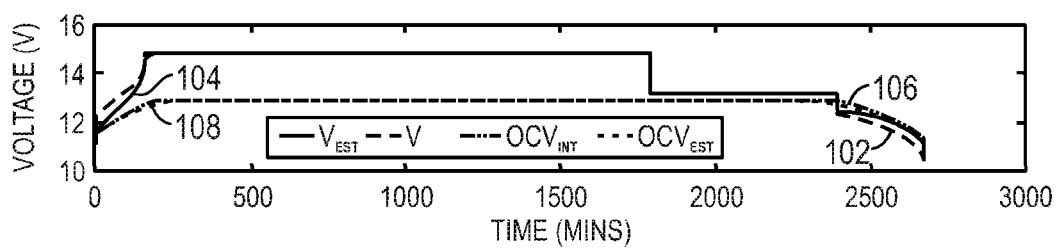
FIG. 8B
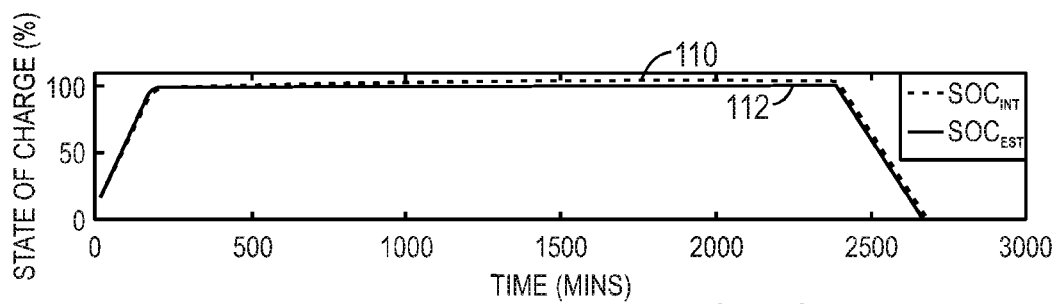
FIG. 8C